United States Patent [19]
Ohmae

[11] Patent Number: 5,821,588
[45] Date of Patent: Oct. 13, 1998

[54] TRANSISTOR AND SEMICONDUCTOR DEVICE

[75] Inventor: Tsutomu Ohmae, Fukuyama, Japan

[73] Assignee: Sharp Kabushiki Kaisha, Osaka, Japan

[21] Appl. No.: 779,031

[22] Filed: Jan. 6, 1997

[30]     Foreign Application Priority Data

Mar. 26, 1996  [JP]  Japan ...................................... 8-070459

[51] Int. Cl.⁶ ........................... H01L 29/76; H01L 29/94; H01L 31/062; H01L 31/113
[52] U.S. Cl. ........................... 257/366; 257/365; 257/392
[58] Field of Search .................................. 257/316, 317, 257/320, 365, 366, 392

[56]              References Cited

U.S. PATENT DOCUMENTS

| | | | |
|---|---|---|---|
| 4,099,196 | 7/1978 | Simko | 257/320 |
| 4,330,850 | 5/1982 | Jacobs et al. | 257/320 |
| 4,503,519 | 3/1985 | Arakawa | 257/320 |
| 4,652,897 | 3/1987 | Okuyama et al. | 257/316 |
| 4,716,446 | 12/1987 | Esser et al. | 257/365 |
| 5,252,847 | 10/1993 | Arima et al. | 257/320 |
| 5,402,371 | 3/1995 | Ono | 257/316 |
| 5,477,068 | 12/1995 | Ozawa | 257/366 |

FOREIGN PATENT DOCUMENTS

| | | |
|---|---|---|
| A-61-34964 | 2/1986 | Japan . |
| 04318975 A | 11/1992 | Japan . |
| 07115178 A | 5/1995 | Japan . |

*Primary Examiner*—Ngân V. Ngô
*Attorney, Agent, or Firm*—Nixon & Vanderhye P.C.

[57]               ABSTRACT

An object of the invention is to provide a transistor in which the channel length of the transistor is changed depending on voltages applied to plural gate electrodes which are dividedly formed, and plural kinds of operation states are attained. In a MOS transistor 31, a second gate electrode 36 is formed via an insulating film 35 on a first gate electrode 34 formed in a region E2. The channel length formed in a semiconductor substrate 32 is determined in accordance with the combination of voltages applied to the first and second gate electrodes 34 and 36. The MOS transistor 31 can operate in either of states of different threshold voltages.

13 Claims, 7 Drawing Sheets

TRANSISTOR AND SEMICONDUCTOR DEVICE

BACKGROUND OF THE INVENTION

1. Field of the Invention

The present invention relates to a MOSFET (a field effect transistor composed of a metal oxide semiconductor, hereinafter referred to as "MOS transistor"), and particularly to a MOS transistor in which gate electrodes are formed in two layers.

2. Description of the Related Art

Figure 7:
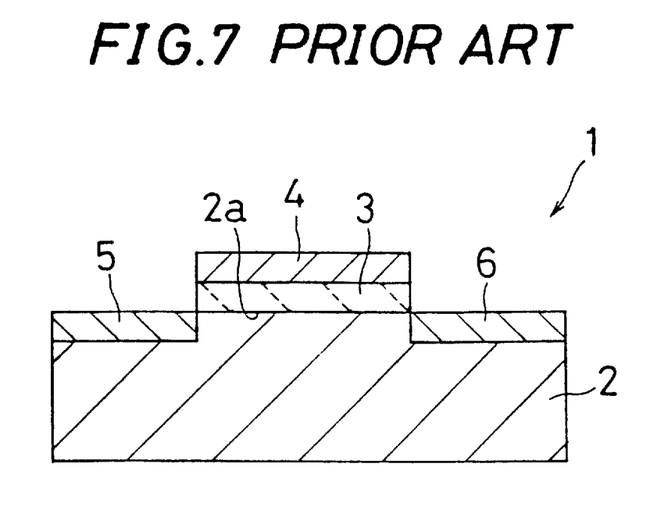
FIG. 7 is a sectional view of a MOS transistor 1 of an example of a typical prior art.

FIG. 7 is a sectional view of a MOS transistor 1 which is an example of a typical prior art. When the MOS transistor 1 is, for example, an N-channel MOS transistor, an insulating film 3 is formed in a predetermined region of one surface 2a of a P-type semiconductor substrate 2, and a gate electrode 4 is formed on the insulating film 3.

Diffusion layers 5 and 6 are formed so as to sandwich the region where the gate electrode 4 is formed, by diffusing an N-type impurity from the one surface 2a of the semiconductor substrate 2. The source and drain electrodes are connected to the diffusion layers 5 and 6, respectively. When a voltage which is not lower than a predetermined threshold voltage Vth is applied to the gate electrode 4, a channel region is formed between the diffusion layers 5 and 6, and a current flows between the diffusion layers 5 and 6 through the channel region. The threshold voltage Vth depends on the length of the channel region which is so-called the channel length, the impurity concentration of the channel region, the thickness of the insulating film 3, etc.

A gate array which is configured by arranging such MOS transistors 1 in a matrix form is widely used as a configuration which can cope with various requests of the users for recent LSIs (Large-Scale Integrated circuits) in a short period. A gate array is configured by arranging so-called basic cells which are previously subjected to processes up to the diffusion process, in a matrix form. The user can selectively connect the gate electrodes and the diffusion layers with conductor layers including the source and drain electrodes, thereby forming an LSI having a desired function. Therefore, the user is required only to determine the manner of connecting the basic cells, and the development period can be shortened as compared with the case where the arrangement of the MOS transistors 1 and the like is determined after an specification of an LSI is settled.

In a gate array, for example, CMOS (Complementary Metal Oxide Silicon) transistors are formed. A CMOS transistor requires a larger area for one transistor than a conventional MOS transistor. In order to increase the number of transistors which can be formed in a fixed area, therefore, various methods such as that in which a circuit is configured by stacking P-channel and N-channel transistors are employed. An example of the technique of configuring a circuit by stacking transistors is disclosed in U.S. Pat. No. 4,555,843, issued Dec. 3, 1985.

In a CMOSFET described in the patent publication, an oxide film is formed so as to cover a first transistor of one conductivity type which is formed in the same manner as the above-described MOS transistor 1, thereby insulating the gate electrode of the first transistor. The gate electrode of the first transistor operates also as the gate electrode of a second transistor of the other conductivity type. A polysilicon layer which will be formed as the channel region and the source and drain regions of the second transistor is formed so as to cover the oxide file. The turn-on and turn-off of the first and second transistors are controlled by a voltage applied to the common gate electrode.

Figure 8:
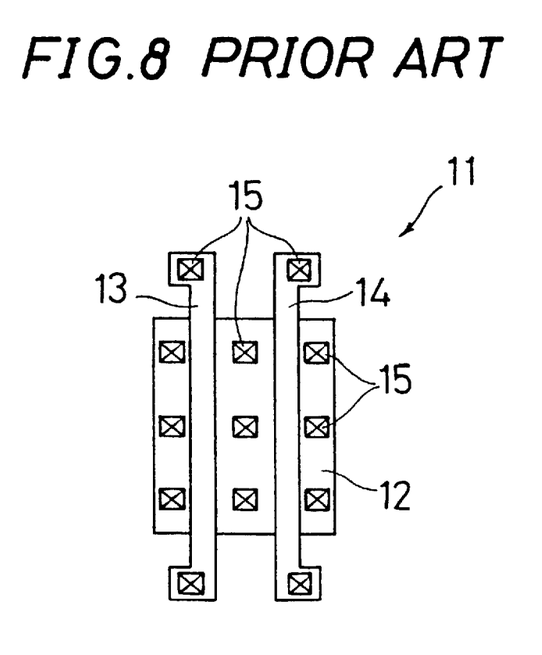
FIG. 8 is a plan view of a basic cell 11 of a gate array of an example of a typical prior art.

FIG. 8 is a plan view of a basic cell of a gate array which is a typical prior art example. The basic cell 11 of FIG. 8 is a basic cell of N-channel MOS transistors, and comprises an N-type diffusion layer 12 forming the source/drain region, and gate electrodes 13 and 14. An insulating film is formed so as to cover the diffusion layer 12 and the gate electrodes 13 and 14, and a conductor layer is formed so as to cover the insulating film. The gate electrodes 13 and 14, and the diffusion layer 12 are connected to the conductor layer through any one of plural contact regions 15 which are disposed in the insulating film.

In the basic cell 11 shown in FIG. 8, for example, in the case where the gate array is formed to have a narrow width and a structure in which a relative small current is allowed to flow through the cell, the gate array configured by the basic cell 11 is used for forming a circuit such as that used in a signal input section. One gate array is configured by one kind of basic cells. Consequently, the gate array configured by the basic cell 11 has a small gate width and cannot be used for forming a circuit through which a large current must flow, such as that which is to be used in an output section. A circuit through which a large current can flow must be configured by using a gate array having another structure in which the gate width is larger.

As described above, in accordance with the amount of a current flowing through a circuit, several kinds of gate arrays respectively configured by basic cells of different gate widths must be prepared. This produces problems such as that the use efficiency of the basic cells is lowered, and that the freedom of the circuit design is lowered.

Figure 9:
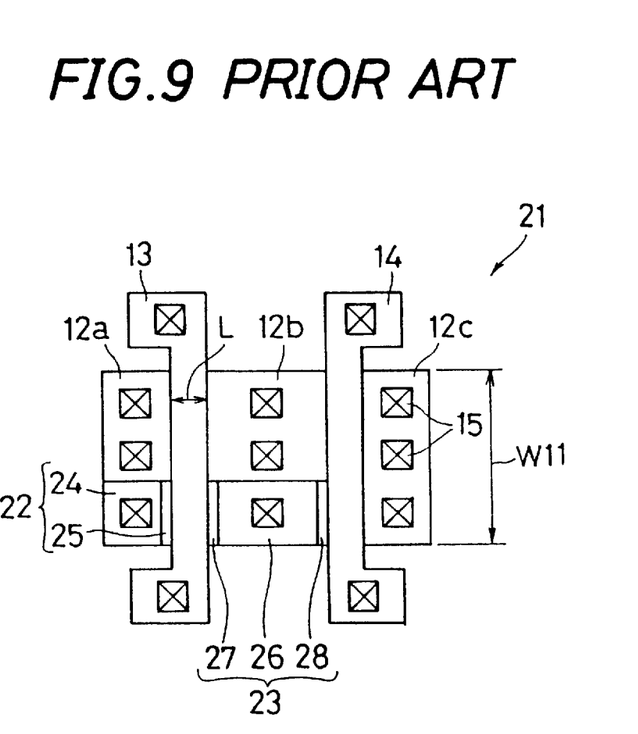
FIG. 9 is a plan view of a basic cell 21.

An art which can solve the problems is disclosed in Japanese Unexamined Patent Publication JP-A 7-115178 (1995). FIG. 9 is a plan view of a basic cell 21 disclosed in the patent publication. In the basic cell 21, the components identical with those of the above-described basic cell 11 are designated by the same reference numerals, and their description is omitted. The diffusion layer 12 is shown as diffusion layers 12a, 12b, and 12c which are respectively in regions separated by the gate electrodes 13 and 14.

The basic cell 21 is configured in the following manner. Ion implantation is conducted on the diffusion layers 12a, 12b, and 12c by using a mask of a predetermined shape corresponding to desired values of the gate width and the gate length, thereby forming diffusion layers 24 to 28 so as to form source and drain regions 22 and 23. As a result, the desired gate width W and gate length L are obtained. The basic cell 21 is formed so that the gate has a width of, for example, W11. In the case where the basic cell 21 is a cell of N-channel MOS transistors, the diffusion layers 12a to 12c are P-type diffusion layers, the diffusion layers 24 and 26 are $N^+$-type diffusion layers, and the diffusion layers 25, 27, and 28 are $N^-$-type diffusion layers.

When the basic cells 21 are to be arranged in a matrix form so as to constitute a gate array, the diffusion layers 24 to 28 are formed only in desired basic cells 21 so that the gate width and the like of the basic cells are changed and the properties such as the threshold voltage are changed. Therefore, the use efficiency of the basic cells is prevented from being lowered, and elements constituting the circuit can be arranged in a relatively free manner.

Even when a gate array is to be configured by the basic cells 21, however, the steps such as ion implantation for forming the diffusion layers are conducted after the gate widths of MOS transistors and the like are determined in accordance with the use of the gate array and the specific circuit configuration. Therefore, it is difficult to develop an LSI in a short period.

When a memory element is to be configured by using a MOS transistor, it is known to use a structure such as that in which gate electrodes are formed in two layers. An example of the technique of forming gate electrodes in two layers is disclosed in Japanese Unexamined Patent Publication JP-A 4-318975 (1992). In a MOS transistor disclosed in the patent publication, an insulated gate layer which can hold charges under the field erasion state is disposed between a semiconductor layer and a memory gate electrode. The source and drain regions are disposed in the semiconductor layer which is sufficiently separated from the region corresponding to the memory gate electrode.

A switching electrode which is a second gate electrode is disposed on the semiconductor layer between the source and drain regions so as to cover the memory gate electrode via an insulating layer. The operations of writing, erasure, and reading data are performed by controlling electron injection or ejection on the insulated gate layer. The electron injection or ejection is performed by controlling the voltages applied to the source and drain electrodes connected to the source and drain regions, and the voltages applied to the switching electrode and the memory gate electrode.

When any one of the writing, erasing, and reading operations is to be performed, a voltage Von is applied to the switching electrode. When the writing operation is to be performed, the drain and source electrodes are grounded, and a voltage Vp which is not lower than the voltage Von is applied to the memory gate electrode. When the voltages are applied, electrons are injected into the insulated gate layer. When the erasing operation is to be performed, the voltage Vp is applied to the drain and source electrodes and the memory gate electrode is grounded. When the voltages are applied, electrons are ejected from the insulated gate layer. When the reading operation is to be performed, the memory gate electrode is grounded and a predetermined voltage is applied across the source and the drain. From the drain current flowing during the voltage application, it is judged whether data is written in the MOS transistor or not.

In the prior art disclosed in Japanese Unexamined Patent Publication JP-A 4-318975 (1992), there exist plural operation states depending on the voltages applied to the electrodes. The current flowing through the circuit is changed by injection or ejection of electrons on the insulated gate layer. From the view point of the insulation of the circuit, the circuit cannot be used in an output section or a large current cannot flow through the circuit.

In the prior art technique which is disclosed in Japanese Unexamined Patent Publication JP-A 61-34964 (1986) and in which the common gate electrode is used, the turn-on and turn-off of the first and second transistors are controlled by the single gate electrode, and hence it is impossible to change the amounts of the currents respectively flowing through the transistors.

SUMMARY OF THE INVENTION

It is an object of the invention to provide a transistor in which a gate length of the transistor is changed in accordance with voltages applied to plural gate electrodes which are divided into a plural numberand and which have plural kinds of operation states, and also to provide a semiconductor device or a so-called gate array which is constructed by using such transistors.

The invention provides a transistor comprising a gate electrode which is formed via an insulating film on a channel region between a pair of source and drain regions, the gate electrode being divided into plural individual electrodes, wherein a channel length is determined by controlling voltages applied to the individual electrodes, the transistor thereby operating as transistors having different threshold voltages.

According to the invention, since the channel length which is the length of a channel region between the source region and the drain region can be determined by selectively applying voltages to the individual electrodes, the transistor can operate as transistors having different threshold voltages without changing the configuration of the transistor.

The invention is characterized in that:

voltages applied to the plural individual electrodes are individually controlled, the channel length is determined by selectively applying voltages to the individual electrodes except at least one of the individual electrodes, and the conduction and nonconduction between the source and drain regions are controlled by the voltage applied to the at least one individual electrode.

According to the invention, the channel length is determined by selectively applying voltages to the individual electrodes except at least one individual electrode. The turn-on and turn-off of the transistor are controlled by supplying a voltage corresponding to a threshold voltage determined in accordance with the channel length, to the at least one individual electrode. Accordingly, depending on to which electrode among the individual electrodes except at least one individual electrode the voltage is applied, the channel length of the transistor can be determined and hence the threshold voltage is determined. AS a consequence, the transistor can operate as transistors having different threshold voltages without changing the configuration of the transistor.

The invention provides a transistor comprising:

a semiconductor substrate of one conductive type;

a first insulating film which is formed on a whole of one surface of the semiconductor substrate;

a first gate electrode which is formed in a predetermined first region on the first insulating film;

a second insulating film which covers the first gate electrode;

a second gate electrode which is formed in a second region including the first region and, formed via the second insulating film on the first gate electrode in the first region; and first and second diffusion layers of another conductive type which are respectively formed in third and fourth regions opposing to each other via the second region and which respectively function as source and drain regions, wherein a channel length which is formed between the first and second diffusion layers is determined on whether a predetermined voltage is applied to the second gate electrode or not, the transistor thereby operating as transistors having different threshold voltages.

The invention is characterized in that the following states are changed over: a first state in which the predetermined voltage is applied to the second gate electrode, the transistor has a first threshold voltage, and turn-on and turn-off of the transistor are controlled in accordance with a voltage applied to the first gate electrode;

a second state in which the predetermined voltage is not applied to the second gate electrode, the transistor has a second threshold voltage, and turn-on and turn-off of the transistor are controlled in accordance with a voltage applied to the first gate electrode;

a third state in which the first and second gate electrodes are connected to each other, the transistor has a third threshold voltage, and the transistor is turned-on by a voltage applied to the first and second gate electrodes; and a fourth state in which the first and second gate electrodes are connected to each other, the transistor has the third threshold voltage, and the transistor is turned-off by a voltage applied to the first and second gate electrodes.

The invention is characterized in that the first region is located at a position which is at an equal distance or at different distances from the third and fourth regions.

The invention is characterized in that the first region is made contact with either of the third and fourth regions.

According to the invention, the first gate electrode is formed in the first region in the first insulating film formed on the one surface of the semiconductor substrate, and the second gate electrode is formed in the second region including the first region. Hereinafter, the states of the transistor will be described on the assumption that the transistor is an N-channel transistor.

In the first state in which the predetermined voltage is applied to the second gate electrode, an inversion layer is formed in the region of the semiconductor substrate in the second region directly below the second gate electrode and corresponding to the region except the first region, and the diffusion resistance is low. The threshold voltage in the first state is determined by the length of the channel region which is the region of the semiconductor substrate corresponding to the first region directly below the first gate electrode, the impurity concentration of the channel region, and the value of the diffusion resistance of the inversion layer. When a voltage which is not lower than the threshold voltage is applied to the first gate electrode, a current flows between the first and second diffusion layers.

In the second state in which the predetermined voltage is not applied to the second gate electrode, the region of the semiconductor substrate in the second region directly below the second gate electrode and corresponding to the region except the first region functions as an offset region, and the diffusion resistance is high. The threshold voltage in the second state is determined by the length of the channel region which is the region of the semiconductor substrate corresponding to the first region directly below the first gate electrode, the impurity concentration of the channel region, and the value of the diffusion resistance of the offset region. When a voltage which is not lower than the threshold voltage is applied to the first gate electrode, a current flows between the first and second diffusion layers.

In the third and fourth states, the first and second gate electrodes are connected to each other, and a voltage is commonly applied to the gate electrodes. The threshold voltages in the third and fourth states are determined by the length of the region of the semiconductor substrate which is the channel region and directly below the second gate electrode, and the impurity concentration of the region. In the third state, when a voltage which is not lower than the threshold voltage is applied to the first and second gate electrodes, a current flows between the first and second diffusion layers. In the fourth state, a voltage of 0 V is applied to the first and second electrodes.

In each of the two cases, i.e., the case where turn-on and turn-off are controlled by applying the same voltage to the first and second gate electrodes which are connected to each other, and the case where turn-on and turn-off are controlled by a voltage applied to the first gate electrode and determined depending on whether a predetermined voltage is applied to the second gate electrode or not, therefore, the threshold voltage of the transistor is determined. Depending on the states, the transistor can operate as either of transistors of different properties, without changing the configuration of the transistor.

The invention provides a semiconductor device which is configured by arranging a plurality of above-mentioned transistors, and, in each of the transistors, the first and second diffusion layers are selectively connected to the first and second gate electrodes, thereby configuring a desired circuit.

According to the invention, each of the transistors can operate as either of transistors of different threshold voltages, depending on whether a predetermined voltage is applied to the second gate electrode or not. When a semiconductor device is configured only by using the transistor of the invention, therefore, the same circuit configuration as the case where a semiconductor device is configured by transistors of different configurations can be attained by selectively applying voltages to the second electrodes of the transistors.

As described above, according to the invention, the channel length can be determined by selectively applying voltages to the individual electrodes, and hence the transistor can operate as either of transistors having different threshold voltages without changing the configuration of the transistor.

According to the invention, the threshold voltage of the transistor is determined depending on the combination of voltages applied to the electrodes other than at least one individual electrode which controls turn-on and turn-off of the transistor, and hence the transistor can operate as either of transistors having different threshold voltages without changing the configuration of the transistor.

According to the invention, on the first insulating film formed on the one surface of the semiconductor substrate, the first gate electrode is formed in the first region and the second gate electrode is formed in the second region, and hence the channel length formed in the semiconductor substrate is determined in accordance with the combination of voltages applied to the first and second gate electrodes. Consequently, transistors of different thresholds and properties can be obtained by a single configuration.

According to the invention, the transistor can operate as either of transistors having different threshold voltages depending on whether a predetermined voltage is applied to the second gate electrode or not. When a semiconductor device is configured only by using the transistor of the invention, therefore, the same circuit configuration as the case where a semiconductor device is configured by using transistors of different configurations can be attained by selectively applying voltages to the second electrodes of the transistors.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Now referring to the drawings, preferred embodiments of the invention are described below.

Figure 1:
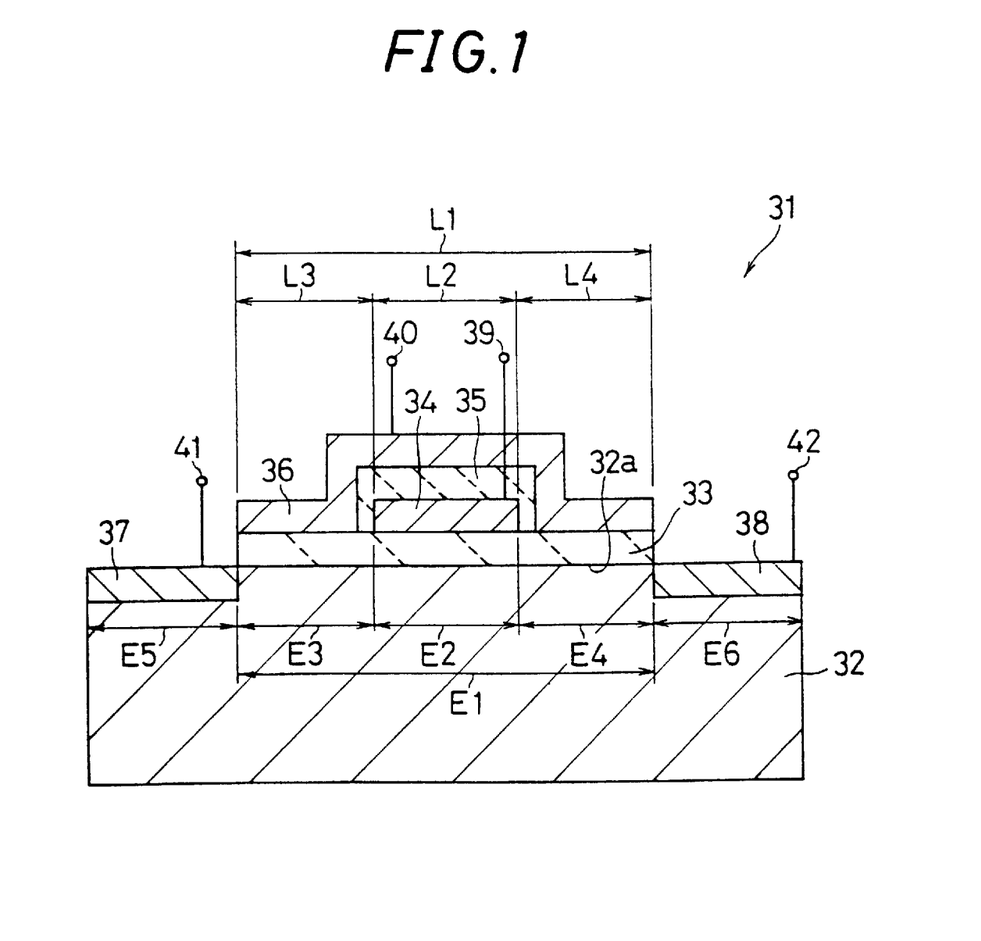
FIG. 1 is a sectional view of a MOS transistor 31 of an embodiment of the invention.

FIG. 1 is a sectional view of a MOS transistor 31 of an embodiment of the invention. In the MOS transistor 31, a gate oxide film 33 is formed over a length L1 in a predetermined region E1 of one surface 32a of a P-type semiconductor substrate 32, and a first gate electrode 34 is formed over a length L2 in a predetermined region E2 on the gate oxide film 33. The impurity concentration of the semiconductor substrate 32 is, for example, $1 \times 10^{17}$ cm$^{-3}$, and the thickness of the gate oxide film 33 is 170 Å.

In the MOS transistor 31, an insulating film 35 is formed so as to cover the first gate electrode 34, and a second gate electrode 36 is integrally formed over the length L1 in the the whole face of the gate oxide film 33 so as to cover the insulating film 35. In the region E2, the second gate electrode 36 is formed on the first gate electrode 34 via the insulating film 35, and, in regions E3 and E4 opposing each other via the region E2 in the region E1, formed on the gate insulating film 33. The insulating film 35 has a sufficient thickness so that the region of the semiconductor substrate 32 corresponding to the region E2 is not affected by a voltage applied to the second gate electrode 36. The insulating film 35 prevents the first and second gate electrodes 34 and 36 from affecting each other. In the specification, the thickness of the insulating film 35 is neglected unless particularly described.

In regions E5 and E6 opposing each other via the region El, N-type diffusion layers 37 and 38 are formed from the one surface 32a of the semiconductor substrate 32. Electrodes 41 and 42 are connected to the diffusion layers 37 and 38. The diffusion layers function as source and drain regions. A terminal 39 is connected to the first gate electrode 34, and a terminal 40 is connected to the second gate electrode 36. Voltages are individually applied to the electrodes.

The MOS transistor 31 is a so-called multivalue transistor which has four kinds of operation states A1 to A4 depending on whether a predetermined voltage is applied to the first and second gate electrodes 34 and 36 or not.

Figure 2A:
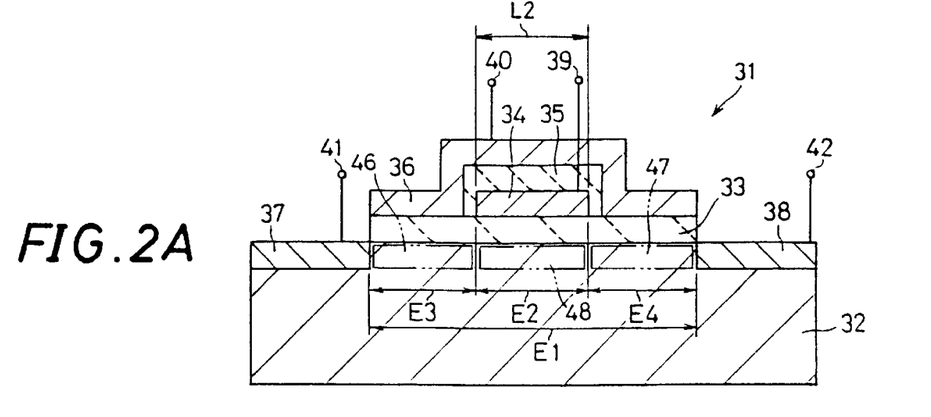
FIGS. 2A to 2C are sectional views illustrating operation states of the MOS transistor 31.
Figure 2B:
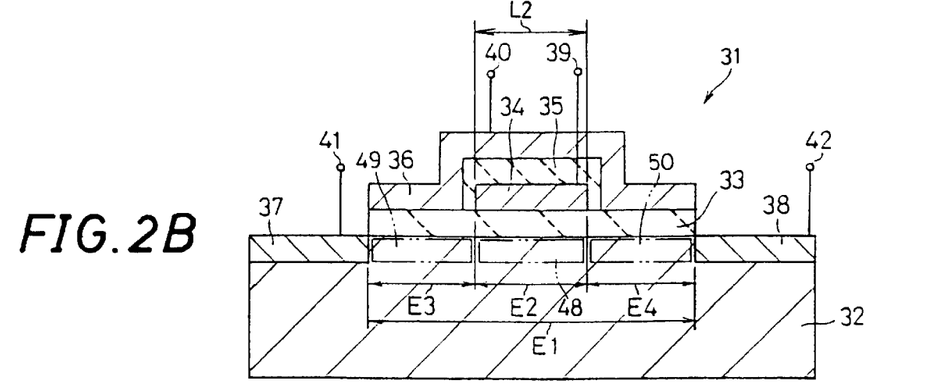
Figure 2C:
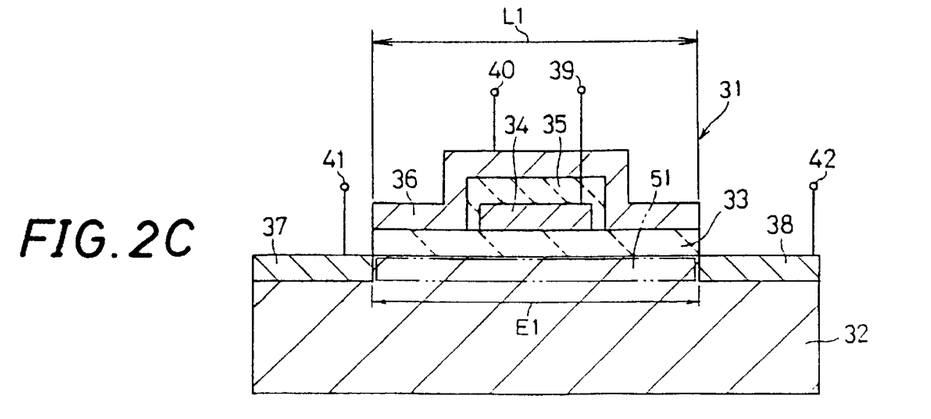

FIGS. 2A to 2C are sectional views illustrating the operation states of the MOS transistor 31. FIG. 2A is a sectional view illustrating the operation of the MOS transistor 31 in the state A1. When a voltage of, for example, 5 V is previously applied to the second gate electrode 36, the MOS transistor 31 attains the state A1. In the state A1, the regions of the semiconductor substrate 32 corresponding to the regions E3 and E4 are caused by the above-mentioned voltage to function as inversion layers 46 and 47, and the resistance of a diffusion resistor is low. In the semiconductor substrate 32, the region corresponding to the region E2 directly below the first gate electrode 34 functions as a channel region 48. The length of the channel region 48 is substantially equal to the length L2 of the first gate electrode 34. The threshold voltage Vth is determined by the concentration of the semiconductor substrate 32 and the length L2 of the first gate electrode 34.

FIG. 2B is a sectional view illustrating the operation of the MOS transistor 31 in the state A2. When a voltage of, for example, 0 V is previously applied to the second gate electrode 36, the MOS transistor 31 attains the state A2. In the state A2, the regions of the semiconductor substrate 32 corresponding to the regions E3 and E4 function as offset regions 49 and 50, and the resistance of a diffusion resistor is high. In the semiconductor substrate 32, the region corresponding to the region E2 directly below the first gate electrode 34 functions as the channel region 48. The length of the channel region 48 is substantially equal to the length L2 of the first gate electrode 34. The threshold voltage Vth in the state A2 is determined by the concentration of the semiconductor substrate 32, the lengths of the offset regions 49 and 50, and the length L2 of the first gate electrode 34.

FIG. 2C is a sectional view illustrating the operation of the MOS transistor 31 in the states A3 and A4. In the states A3 and A4, the first and second gate electrodes 34 and 36 are connected to each other so as to function as a single electrode, and the same voltage is applied to the electrode. When a voltage of, for example, 5 V is simultaneously applied to the gate electrodes 34 and 36, the state A3 is attained, and, when a voltage of 0 V is applied, the state A4 is attained. The state A4 is an off state. In the states A3 and A4, the region of the semiconductor substrate 32 corresponding to the region E1 directly below the first and second gate electrodes 34 and 36 functions as a channel region 51. The length of the channel region 51 is substantially equal to the length L1 of the second gate electrode 36. The threshold voltage Vth in the states A3 and A4 is determined by the concentration of the semiconductor substrate 32 and the length L1 of the second gate electrode 36.

In the states A1 to A4, the properties of the MOS transistor 31 are changed, and hence also the amounts of saturation currents in the states A1 to A4 are different from each other. When the amount of the saturation current in the state A1 is indicated by 1, the amount of the saturation current in the state A2 is 0.1 and that in the state A3 is 0.5.

Figure 3A:
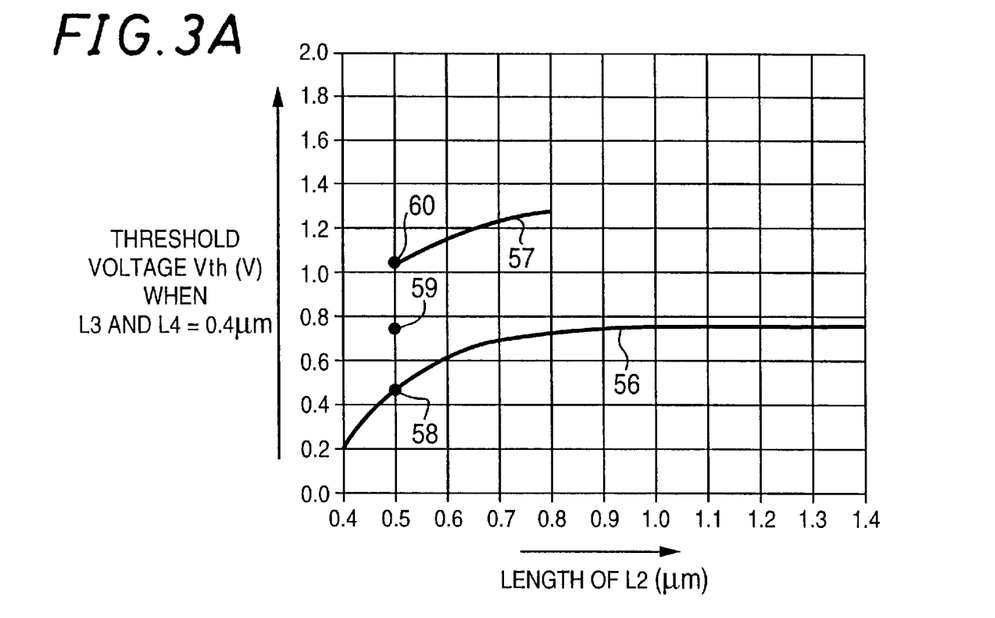
FIGS. 3A and 3B are graphs showing properties of a threshold voltage Vth of the MOS transistor 31.
Figure 3B:
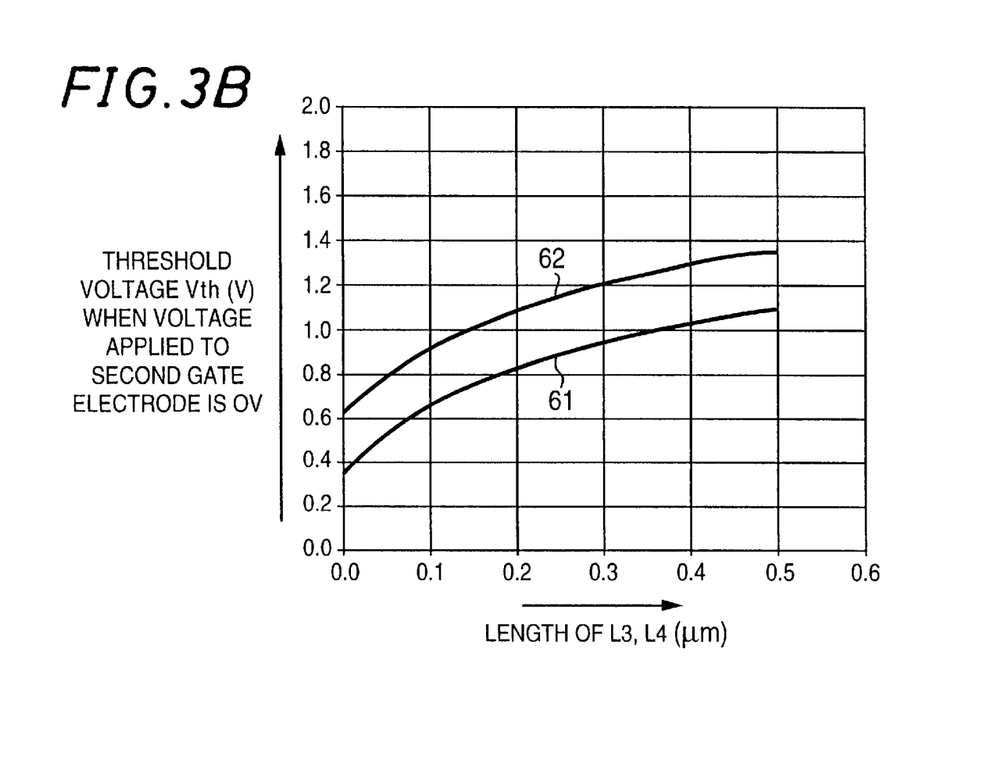

The properties of the MOS transistor 31 in the states A1 to A4 will be described. FIGS. 3A and 3B are graphs showing properties of the threshold voltage Vth of the MOS transistor 31. The graph of FIG. 3A shows the value of the threshold voltage Vth with respect to the length L2 of the first gate electrode 34. In the graph, the lengths L3 and L4 of the regions E3 and E4 are 0.4 μm. The ordinate of the graph indicates the threshold voltage in the case where the lengths L3 and L4 are 0.4 μm, in units of V. The abscissa indicates the value of the length L2 in units of μm.

In the graphs of FIG. 3A, a curve 56 shows changes in the threshold voltage Vth in the case where a voltage of 5 V is previously applied to the second gate electrode 36, and a curve 57 shows changes in the threshold voltage Vth in the case where a voltage of 0 V is previously applied to the second gate electrode 36. As shown by the curve 56, in the case where a voltage of 5 V is applied to the second gate electrode 36, when the length L2 is 0.4 μm, the threshold voltage is 0.2 V, and, as the length L2 is increased, gradually approaches 0.8 V. As shown by the curve 57, in the case where a voltage of 0 V is applied to the second gate electrode 36, when the length L2 is 0.5 μm, the threshold voltage is about 1.0 V, and, when the length L2 is 0.8 μm, the threshold voltage is about 1.3 V.

In the graphs of FIG. 3A, the points 58, 59, and 60 indicate the threshold voltages Vth in the states A1, A3, and A2 in the case where the length L2 is 0.5 µm and the lengths L3 and L4 are 0.4 µm, respectively. In the state A1, the transistor exhibits the properties of a short-channel transistor in which the gate length is 0.5 µm and the threshold voltage Vth is about 0.45 V. In the state A2, the transistor exhibits the properties of an offset transistor and the threshold voltage Vth is about 1.0 V. In the state A3, the transistor exhibits the properties of a long-channel transistor in which the gate length is 1.3 µm and the threshold voltage Vth is about 0.75 V.

In the case where the drain-source voltage is 5 V, in the state A1, when the source voltage Vs is obtained on the assumption that the gate voltage Vg and the drain voltage Vd are 5 V, the resulting source voltage is about 4.25 V. In the state A2, when the source voltage Vs is obtained on the assumption of voltage Vg=Vd=5 V, the resulting source voltage is about 4.55 V. In the state A3, when the source voltage Vs is obtained on the assumption of voltage Vg=Vd=5 V, the resulting source voltage is about 4.0 V.

The graphs of FIG. 3B show the value of the threshold voltage Vth with respect to the lengths L3 and L4 of the regions E3 and E4. In the graph, the ordinate indicates the threshold voltage Vth in the case where the voltage applied to the second gate electrode 36 is 0 V, in units of V, and the abscissa indicates the values of the lengths L3 and L4 of the regions E3 and E4, in units of µm.

In the graphs of FIG. 3B, the curve 61 shows the properties in the case where the length L2 which is the length of the first gate electrode 34 is 0.5 µm, and the curve 62 shows the properties in the case where the length L2 is 0.8 µm. As shown by the curve 61, the threshold voltage in the case where the lengths L3 and L4 are zero is about 0.38 V, and, as the lengths L3 and L4 are increased, is parabolically increased, and the threshold voltage in the case where the lengths L3 and L4 are 0.4 µm is about 1.0 V. As shown by the curve 62, the threshold voltage in the case where the lengths L3 and L4 are zero is about 0.6 V, and, as the lengths L3 and L4 are increased, is parabolically increased, and the threshold voltage in the case where the lengths L3 and L4 are 0.4 µm is about 1.2 V.

Figure 4:
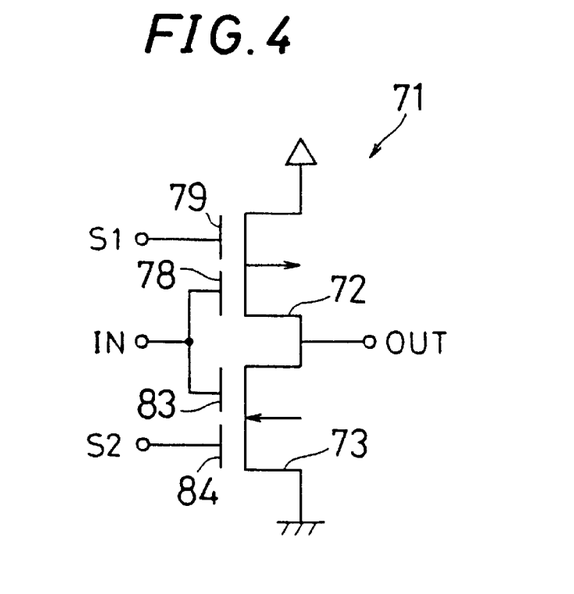
FIG. 4 is a circuit diagram of an inverter circuit 71 configured by the MOS transistor 31.
Figure 5:
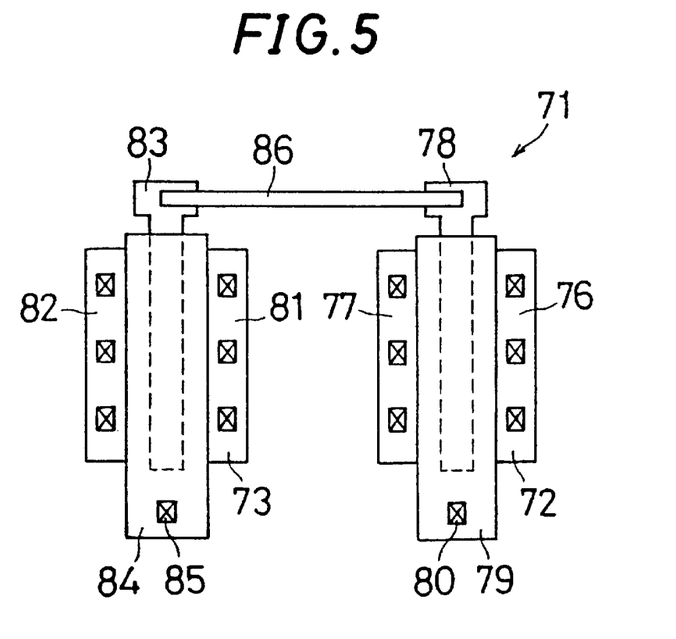
FIG. 5 is a plan view of the inverter circuit 71 which is formed in a gate array.

FIG. 4 is a circuit diagram of an inverter circuit 71 configured by a plurality of MOS transistors 31, and FIG. 5 is a plan view of the inverter circuit 71 which is formed in a gate array. The inverter circuit 71 comprises a P-channel MOS transistor 72 and an N-channel MOS transistor 73 which constitute a basic cell. The inverter circuit 71 can output, as an output signal OUT, the inverted level of an input signal IN which corresponds to a property state setting signal S1 supplied to the MOS transistor 72 and a property state setting signal S2 supplied to the MOS transistor 73.

A predetermined power source voltage which is, for example, 5 V is supplied to the source of the MOS transistor 72. The drain of the transistor is connected to the drain of the MOS transistor 73. The source of the MOS transistor 73 is grounded. Alternatively, the source of the MOS transistor 73 may be connected to a voltage which is set so as to be sufficiently lower than the power source voltage. The potential of the junction of the drains of the MOS transistors 72 and 73 is output as the output signal OUT. The input signal IN is supplied to first gate electrode 78 and 83 of the MOS transistors 72 and 73. The property state setting signal S1 is supplied to a second gate electrode 79 of the MOS transistor 72, and the property state setting signal S2 is supplied to a second gate electrode 84 of the MOS transistor 73.

Referring to FIG. 5, in the MOS transistor 72, diffusion layers 76 and 77 are N-type diffusion layers. The second gate electrode 79 is formed so as to cover the first gate electrode 78. The property state setting signal S1 is supplied to the second gate electrode 79 via a contact 80. In the MOS transistor 73, diffusion layers 81 and 82 are P-type diffusion layers. The second gate electrode 84 is formed so as to cover the first gate electrode 83. The property state setting signal S2 is supplied to the second gate electrode 84 via a contact 85. The first gate electrodes 78 and 83 are connected to each other by a wiring 86. The input signal IN is commonly supplied to the first gate electrodes via the wiring 86. The amount of the saturation current in the inverter circuit 71 can be controlled on the basis of the levels of the property state setting signals S1 and S2.

Figure 6:
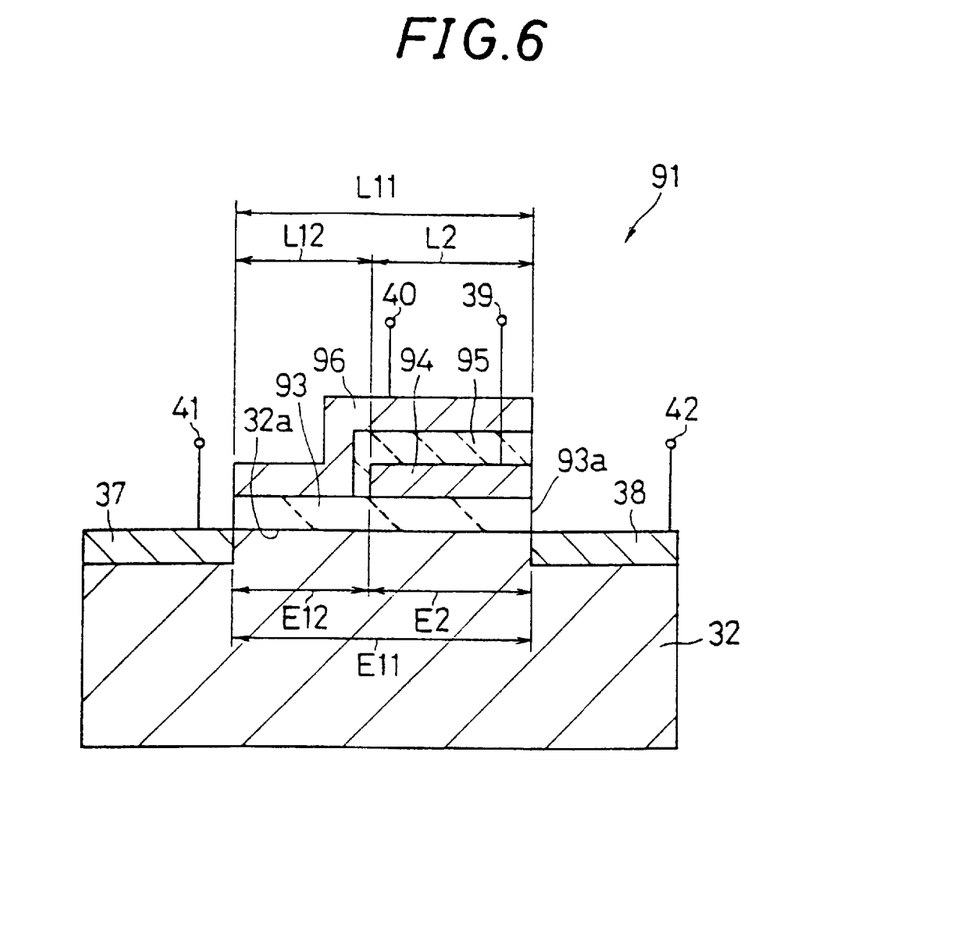
FIG. 6 is a sectional view of a MOS transistor 91 of another example of the embodiment of the invention.

FIG. 6 is a sectional view of a MOS transistor 91 of another example of the embodiment of the invention. The MOS transistor 91 is configured in a similar manner as the above-described MOS transistor 31. The components identical with those of the MOS transistor 31 are designated by the same reference numerals, and their description is omitted. In the MOS transistor 91, first and second gate electrodes 94 and 96 are formed in a laterally asymmetrical manner.

In the MOS transistor 91, a gate insulating film 93 is formed in a region E11 on one surface 32a of a semiconductor substrate 32, and the first gate electrode 94 is formed in a region E2 on the gate insulating film 93. The length of the portion where the gate insulating film 93 is formed is indicated as a length L11. The first gate electrode 94 is formed in a length L2 with starting from one end 93a of the gate insulating film 93. An insulating film 95 is formed so as to cover the first gate electrode 94, and a second gate electrode 96 is integrally formed over the whole face of the gate oxide film 93 so as to cover the insulating film 95. Also in the MOS transistor 91, either of the diffusion layers 37 and 38 may function as the source region. When the diffusion layer 37 is used as the drain and the diffusion layer 38 is used as the source, however, the threshold voltage Vth can be lowered and the response speed of the MOS transistor 91 with respect to a voltage change can be enhanced.

In the same manner as the above-described MOS transistor 31, also in the MOS transistor 91, the region E12 which is directly below the second gate electrode 96 and has a length of L12 is determined to function as an inversion layer or an offset region, depending on whether a predetermined voltage is applied to the second gate electrode 96 disposed in the upper portion or not, with the result that the operation state of the transistor is switched over. Furthermore, the first and second gate electrodes 94 and 96 are integrally operated, and the state of the transistor is determined depending on whether a voltage is applied to the gate electrodes or not.

As described above, according to the embodiment, predetermined voltages are selectively applied to the first gate electrode 34 or 94 and the second gate electrode 36 or 96, thereby allowing the MOS transistor 31 or 91 to operate in either of states of different threshold voltages.

When the present transistor is used in a basic cell constituting a gate array such as the case of the MOS transistors 72 and 73, plural saturation currents can be set in one cell. When signal lines for supplying voltages are to be connected to the first and second gate electrodes 34 and 36, therefore, a transistor can be set so as to have desired operation properties. As a result, a transistor having plural operation properties can be obtained without forming a diffusion layer by conducting ion implantation or the like. Since production steps such as ion implantation are not required, the development period which elapses after the specification of an LSI is determined and until the LSI is actually produced can be shortened.

When basic cells are configured by using the MOS transistor 31 and the basic cells are connected to each other by metal conductors via contacts and the like, it is not necessary to form plural kinds of transistors having different gate widths. In a gate array configured by such basic cells, the use efficiency of the basic cells is not lowered, and the arrangement of conductors in the circuit design can be easily performed.

When a memory element is configured by using the MOS transistor 31, a memory element in which one basic cell has line voltages to be applied to the first and second gate electrodes 34 or 94, and 36 or 96. An application of a high voltage which is required in a prior art memory element is not necessary. A memory cell and a control circuit can be formed integrally or without separating them from each other. Consequently, a gate array including a memory element can be realized in a relatively simple manner.

The invention may be embodied in other specific forms without departing from the spirit or essential characteristics thereof. The present embodiments are therefore to be considered in all respects as illustrative and not restrictive, the scope of the invention being indicated by the appended claims which come within the meaning and the range of equivalency of the claims are therefore intended to be embraced therein.

What is claimed is:

1. A transistor comprising a gate electrode formed over an insulating film on a channel region between a pair of source and drain regions, the gate electrode being divided into individual first and second gate electrodes, and the first and second gate electrodes each selectively connectable to a first and second voltage sources, where the first and second voltage sources have unequal voltage levels and at least one of said sources is not a ground voltage;

wherein a channel length is determined by controlling voltages applied to the individual gate electrodes, the transistor having different threshold voltages dependent on the voltages applied to the gate electrodes to control the channel length, wherein the threshold voltages include;

a first threshold voltage due to a first predetermined voltage, applied from the first voltage source to the second gate electrode to form an inversion layer in a semiconductor substrate region below the second gate electrode;

a second threshold voltage due to a second predetermined voltage applied from the second voltage source to the second gate electrode and the inversion layer is absent from the substrate region below the second gate electrode, and a third threshold voltage due to a predetermined voltage, other than a ground voltage, selectively applied from the first or second voltage source to the first and second gate electrodes.

2. The transistor of claim 1, wherein voltages applied via the contacts to the gate electrodes are individually controlled, the channel length is determined by selectively applying voltages to the gate electrodes, and where conduction and nonconduction between the source and drain regions are controlled by the voltage applied to at least one gate electrode.

3. A transistor comprising:

a semiconductor substrate of one conductive type;

a first insulating film which is formed over an entire surface of the semiconductor substrate;

a first gate electrode which is formed in a predetermined first region on the first insulating film, where said first gate electrode is selectively connectable to first and second voltage sources, where the first and second voltage sources have unequal voltage levels, and at least one of said sources is not a ground voltage;

a second insulating film which covers the first gate electrode;

a second gate electrode which is formed in a second region including the first region, where the second insulating film is formed over the first gate electrode in the first region, and where said second gate electrode is selectively connected to the first and second voltage sources; and first and second diffusion layers of another conductive type which are respectively formed in third and fourth regions opposing to each other via the second region and which respectively function as source and drain regions, wherein a channel length which is formed between the first and second diffusion layers is determined by whether predetermined voltages are applied to the second gate electrode, the transistor having different threshold voltages, wherein the threshold voltages include;

a first threshold voltage due to a first predetermined voltage, applied by the first voltage source to the second gate electrode to form an inversion layer in a semiconductor substrate region below the second gate electrode;

a second threshold voltage due to a second predetermined voltage applied by the second voltage source to the second gate electrode and the inversion layer is absent from the substrate region below the second gate electrode, and a third threshold voltage due to a predetermined voltage, other than a ground voltage, selectively applied by the first or second voltage source to the first and second gate electrodes.

4. The transistor of claim 1 or 3, wherein the following states are changed over:

a first state in which the first predetermined voltage is applied by the first voltage source to the second gate electrode, the transistor has the first threshold voltage, and turn-on and turn-off of the transistor are controlled in accordance with a voltage applied to the first gate electrode;

a second state in which the second predetermined voltage is applied by the second voltage source to the second gate electrode, the transistor has the second threshold voltage, and turn-on and turn-off of the transistor are controlled in accordance with a voltage applied to the first gate electrode;

a third state in which the first and second gate electrodes are connected to each other, the transistor has the third threshold voltage, and the transistor is turned-on by the first predetermined voltage applied by the first voltage source to the first and second gate electrodes; and a fourth state in which the first and second gate electrodes are connected to each other, the transistor has the third threshold voltage, and the transistor is turned-off by the second predetermined voltage applied by the second voltage source to the first and second gate electrodes.

5. The transistor of claim 3, wherein the first region is located at a position which is at an equal distance or at different distances from the third and fourth regions.

6. The transistor of claim 3, wherein the first region is made contact with either of the third and fourth regions.

7. A semiconductor device which is configured by arranging a plurality of transistors of claim 3, in each of which the first and second diffusion layers are selectively connected to the first and second gate electrodes, thereby configuring a desired circuit.

8. A transistor as in claim 1 wherein:
the first threshold voltage has an absolute value less than an absolute value of the third threshold voltage, and the absolute value of the third threshold voltage is less than an absolute value of the second threshold voltage.

9. A transistor as in claim 3 wherein:
the first threshold voltage has an absolute value less than an absolute value of the third threshold voltage, and the absolute value of the third threshold voltage is less than an absolute value of the second threshold voltage.

10. A transistor as in claim 1 wherein
the first threshold voltage provides the transistor with a short channel characteristic;
the second threshold voltage provides the transistor with an offset channel characteristic, and
the third threshold provides the transistor with a long channel characteristic.

11. A transistor as in claim 3 wherein
the first threshold voltage provides the transistor with a short channel characteristic;
the second threshold voltage provides the transistor with an offset channel characteristic, and
the third threshold provides the transistor with a long channel characteristic.

12. In an inverter having a pair of transistors, an input and an output, wherein the transistors each comprise:
a gate electrode formed over an insulating film on a channel region between a pair of source and drain regions, the gate electrode being divided into individual input and setting gate electrodes, wherein the drains of the pair of transistors are commonly coupled to the output of the inverter, and the input gate electrodes of the transistors are commonly coupled to the input of the inverter;

a channel length determined by controlling voltages selectively applied from a first and a second voltage source to each of the individual gate electrodes, where a the first and second voltage sources have unequal voltage levels, and at least one of said voltage sources is not a ground voltage, wherein the transistors each have threshold voltages that vary dependent on the voltages applied to the gate electrodes to control the channel length, wherein the threshold voltages for each transistor includes;

a first threshold voltage due to a first predetermined voltage, other than a ground voltage, applied from the first voltage source to the setting gate electrode to form an inversion layer in a semiconductor substrate region below the setting gate electrode; and a second threshold voltage due to a second predetermined voltage applied from second voltage source to the setting gate electrode and the inversion layer is absent from the substrate region below the setting gate electrode.

13. An inverter comprising:
a first transistor having a first gate electrode formed over an insulating film on a first channel region between a first pair of source and drain regions, the first gate electrode being divided into individual input and setting gate electrodes, a second transistor having a second gate electrode formed over an insulating film on a second channel region between a second pair of source and drain regions, the second gate electrode being divided into individual input and setting gate electrodes, wherein the drain of the second transistor is commonly coupled to the drain of the first transistor;

an input commonly coupled to the input gate electrodes of the first and second transistors;

an output commonly coupled to the drains of the first and second transistors;

wherein a saturation current in the inverter is controlled by selectively applying voltages from voltage sources to both of the setting gate electrodes to vary threshold voltage levels of the transistors.

* * * * *